United States Patent
Song et al.

(10) Patent No.: US 11,762,256 B2
(45) Date of Patent: Sep. 19, 2023

(54) LIGHT EMITTING DIODE PACKAGE AND ELECTRONIC DEVICE INCLUDING THE SAME

(71) Applicant: SAMSUNG ELECTRONICS CO., LTD., Suwon-si (KR)

(72) Inventors: Jongsup Song, Hwaseong-si (KR); Tetsuo Ariyoshi, Suwon-si (KR); Taehyun Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 104 days.

(21) Appl. No.: 17/371,703

(22) Filed: Jul. 9, 2021

(65) Prior Publication Data

US 2022/0163861 A1  May 26, 2022

(30) Foreign Application Priority Data

Nov. 26, 2020 (KR) .......................... 10-2020-0161244

(51) Int. Cl.
| | |
|---|---|
| *F21K 9/69* | (2016.01) |
| *F21K 9/64* | (2016.01) |
| *G02F 1/157* | (2006.01) |
| *G02F 1/163* | (2006.01) |

(52) U.S. Cl.
CPC ................ *G02F 1/157* (2013.01); *F21K 9/64* (2016.08); *F21K 9/69* (2016.08); *G02F 1/163* (2013.01)

(58) Field of Classification Search
CPC .......... F21Y 2113/10; F21K 9/00; F21K 9/69; F21K 9/64; F21S 43/14; F21V 14/003; F21V 29/85
See application file for complete search history.

(56) References Cited

U.S. PATENT DOCUMENTS

| | | | |
|---|---|---|---|
| 6,372,608 | B1 | 4/2002 | Shimoda et al. |
| 6,441,943 | B1 * | 8/2002 | Roberts ................. F21S 43/14 |
| | | | 362/485 |
| 6,645,830 | B2 | 11/2003 | Shimoda et al. |
| RE38,466 | E | 3/2004 | Inoue et al. |
| 6,818,465 | B2 | 11/2004 | Biwa et al. |

(Continued)

FOREIGN PATENT DOCUMENTS

| | | |
|---|---|---|
| JP | 4654639 B2 | 3/2011 |
| JP | 2012-004168 A | 1/2012 |

(Continued)

*Primary Examiner* — William J Carter
(74) *Attorney, Agent, or Firm* — Lee IP Law, P.C.

(57) ABSTRACT

A light emitting diode (LED) package includes a substrate having a pair of first wiring electrodes and a pair of second wiring electrodes, an LED chip on the substrate, the LED chip being electrically connected to the pair of first wiring electrodes, a wavelength conversion film on the LED chip, an electrochromic film on the wavelength conversion film, the electrochromic film electrically connected to the pair of second wiring electrodes, and the electrochromic film being configured to have a first color before application of a voltage and to be transparent after application of the voltage, an optical lens on the electrochromic film, and a lateral structure having a reflective layer covering at least a portion of a lateral surface of each of the LED chip and the wavelength conversion film, and a color layer on the reflective layer and having a second color.

20 Claims, 15 Drawing Sheets

(56) References Cited

U.S. PATENT DOCUMENTS

| | | |
|---|---|---|
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,278,760 B2 | 10/2007 | Heuser et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,648,371 B2 * | 2/2014 | Kuo ........................ H01L 33/58 362/465 |
| 8,735,931 B2 | 5/2014 | Han et al. |
| 8,766,295 B2 | 7/2014 | Kim |
| 8,814,385 B2 | 8/2014 | Onaka et al. |
| 10,619,826 B2 * | 4/2020 | Mao ........................ G02B 26/005 |
| 2014/0374786 A1 | 12/2014 | Bierhuizen |
| 2019/0148607 A1 | 5/2019 | Wang |

FOREIGN PATENT DOCUMENTS

| | | |
|---|---|---|
| JP | 6253949 B2 | 12/2017 |
| JP | 6728764 B2 | 7/2020 |
| KR | 10-2020-0030744 A | 3/2020 |

* cited by examiner

LIGHT EMITTING DIODE PACKAGE AND ELECTRONIC DEVICE INCLUDING THE SAME

CROSS-REFERENCE TO RELATED APPLICATION

Korean Patent Application No. 10-2020-0161244 filed on Nov. 26, 2020, in the Korean Intellectual Property Office, and entitled: "LED Package and Electronic Device Including the Same," is incorporated by reference herein in its entirety.

BACKGROUND

1. Field

Embodiments relate to a light emitting diode (LED) package and an electronic device including the same.

2. Description of the Related Art

A light emitting diode (LED) may have various advantages, e.g., low power consumption, high brightness, long lifespan, and the like. For example, an LED package including an LED chip may be implemented as a flash module of an electronic device, e.g., a mobile phone.

SUMMARY

According to an aspect of embodiments, an LED package includes a substrate with a pair of first wiring electrodes and a pair of second wiring electrodes, an LED chip disposed on the substrate and electrically connected to the pair of first wiring electrodes, a wavelength conversion film disposed on the LED chip, an electrochromic film disposed on the wavelength conversion film, electrically connected to the pair of second wiring electrodes, and configured to have a first color before application of a voltage and converted to be transparent after application of the voltage, an optical lens disposed on an upper surface or a lower surface of the electrochromic film, and a lateral structure including a reflective layer covering at least a portion of a lateral surface of each of the LED chip and the wavelength conversion film, and a color layer disposed on the reflective layer and having a second color.

According to another aspect of embodiments, an LED package includes a substrate, an LED chip disposed on the substrate, a wavelength conversion film disposed on the LED chip, an electrochromic film disposed on the wavelength conversion film and configured to be opaque before application of a voltage and converted to be transparent after application of the voltage, and a reflective layer covering a lateral surface of the LED chip and a lateral surface of the wavelength conversion film.

According to yet another aspect of embodiments, an electronic device includes a set cover with a transparent cover having an optical window, and having a first color, and an LED package disposed within the set cover to emit light through the optical window, wherein the LED package includes a substrate, an LED chip disposed on the substrate, an electrochromic film disposed on the LED chip, and configured to be opaque before application of a voltage and to have a second color, and converted to be transparent after application of the voltage, a reflective layer covering a lateral surface of the LED chip, and a color layer disposed on the reflective layer and having a third color.

BRIEF DESCRIPTION OF DRAWINGS

Features will become apparent to those of skill in the art by describing in detail exemplary embodiments with reference to the attached drawings, in which:

FIG. 6B is a cross-sectional view of an optical sensor in the LED package of

FIG. 6A.

DETAILED DESCRIPTION

Figure 1A:
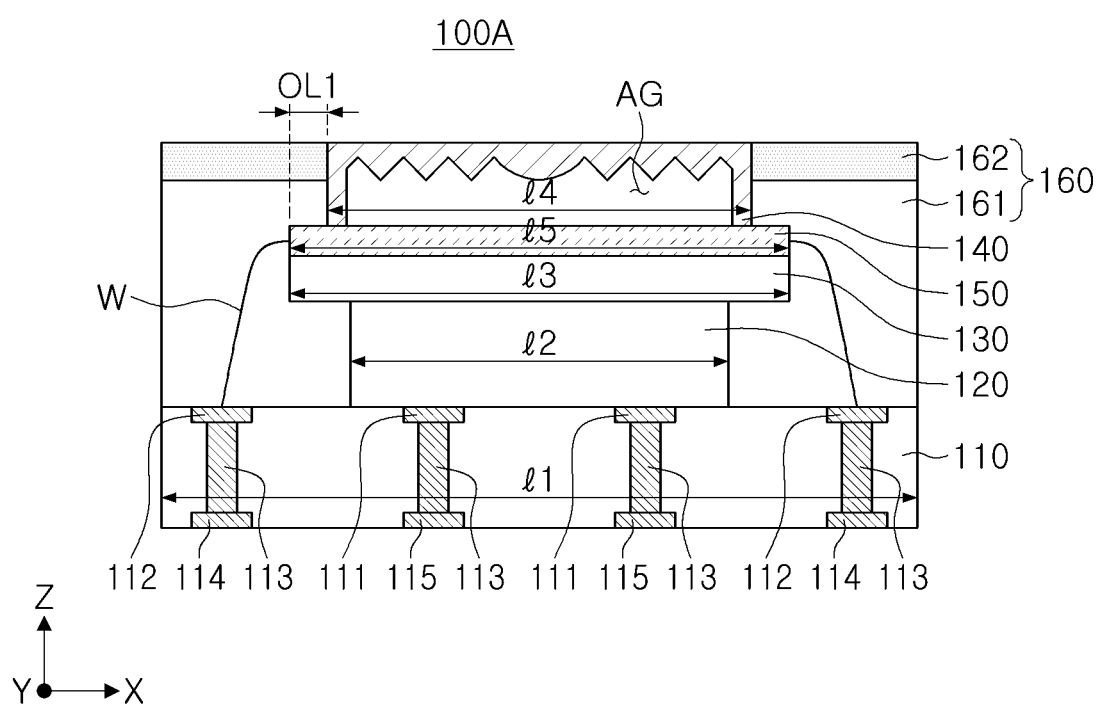
FIG. 1A is a cross-sectional view of an LED package according to an embodiment.
Figure 1B:
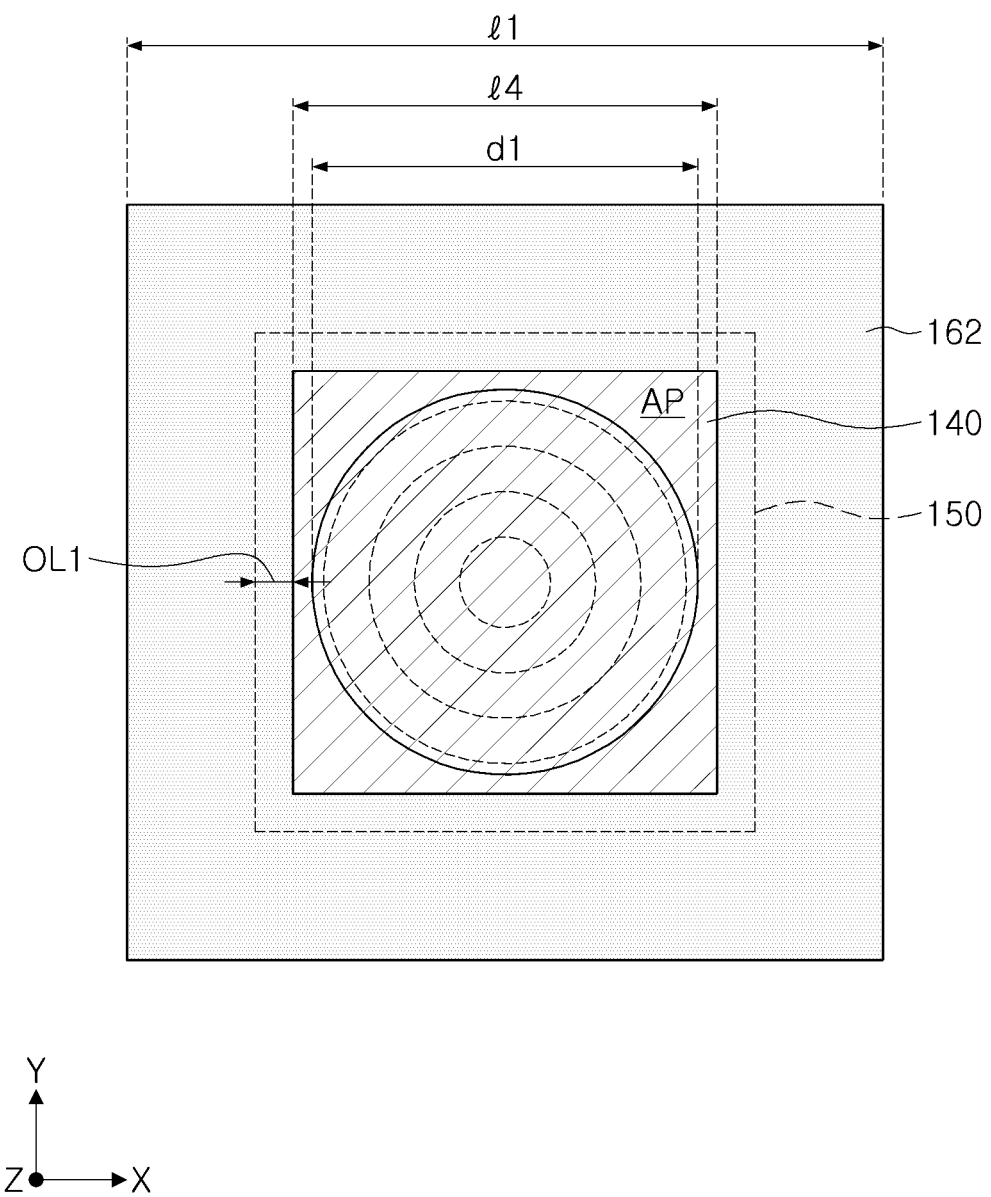
FIG. 1B is a plan view of the LED package of FIG. 1A.

FIG. 1A is a cross-sectional view illustrating an LED package 100A according to an embodiment, and FIG. 1B is a plan view of the LED package 100A of FIG. 1A. FIG. 1B illustrates an upper surface of the LED package 100A of FIG. 1A.

Referring to FIGS. 1A and 1B, the LED package 100A may include a substrate 110, an LED chip 120, a wavelength conversion film 130, an optical lens 140, an electrochromic film 150, and a lateral structure 160. In an embodiment, the LED package 100A may be configured to emit white light, and may be employed as a flash module of an electronic device, but is not limited thereto.

The substrate 110 may have an upper surface on which at least a pair of first wiring electrodes 111 and a pair of second wiring electrodes 112 are disposed, and may include a circuit connected to the pair of first wiring electrodes 111 and the pair of second wiring electrodes 112 therein. For example, the substrate 110 may include the pair of first wiring electrodes 111 and the pair of second wiring electrodes 112, disposed on the upper surface thereof, first external wiring electrodes 115 and second external wiring electrodes 114, disposed on a lower surface thereof, and wiring vias 113 connecting the first wiring electrodes 111, the second wiring electrodes 112, the first external wiring electrodes 115, and the second external wiring electrodes 114, corresponding to each other. For example, a first wiring electrode 111 may be electrically connected to a first external wiring electrode 115 through a wiring via 113, and a second wiring electrode 112 may be electrically connected to a second external wiring electrode 114 through a wiring via 113. In the drawings, only the wiring via 113 connecting the first wiring electrodes 111, the second wiring electrodes 112, the first external wiring electrodes 115, and the second external wiring electrodes 114 is illustrated, but a circuit in the substrate 110 is not limited to structures illustrated in the drawings, and may be formed of a plurality of wiring layers and via layers, or may be formed to have a lead terminal form.

In an example, the LED package 100A may be mounted on another substrate (e.g., a main board) to receive a driving signal or the like externally through the first external wiring electrodes 115 and the second external wiring electrodes 114. The LED package 100A may be mounted on another substrate, e.g., by a flip-chip method, but is not limited thereto. The pair of first wiring electrodes 111 and the pair of second wiring electrodes 112 may be connected to the LED chip 120 and the electrochromic film 150, respectively, and the pair of first wiring electrodes 111 and the pair of second wiring electrodes 112 may be electrically insulated from each other in the substrate 110. Therefore, in a state of being mounted on an electronic device, the LED chip 120 and the electrochromic film 150 may be interlocked with other applications, and may operate independently. The substrate 110 may be, e.g., a printed circuit board (PCB), a metal core PCB (MCPCB), a metal PCB (MPCB), or a flexible PCB (FPCB). A length $\ell 1$ of the substrate 110 in a horizontal direction (an X-axis direction) may be longer than a length ($\ell 2$, $\ell 3$, $\ell 4$, or $\ell 5$) of each of the LED chip 120, the wavelength conversion film 130, the optical lens 140, and the electrochromic film 150 in the horizontal direction (the X-axis direction).

The LED chip 120 may be disposed on the substrate 110, and a lateral surface thereof may be surrounded by the lateral structure 160. The LED chip 120 may be electrically connected to the pair of first wiring electrodes 111. In an embodiment, the LED chip 120 may be mounted on the substrate 110 by a flip-chip method. Therefore, the LED chip 120 may include a pair of electrodes electrically connected to the pair of first wiring electrodes 111 through a connection member, e.g., a solder, a bump, or the like. In another example, the LED chip 120 may be mounted on the substrate 110 by a wire-bonding method. In this case, a bonding wire of the LED chip 120 may be covered by a reflective layer 161.

Figure 1C:
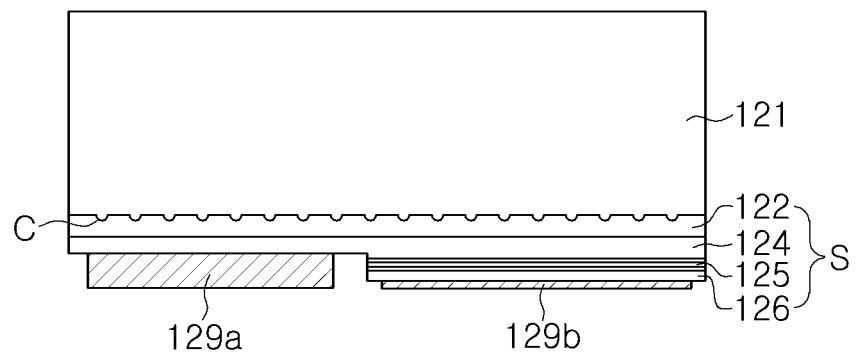
FIGS. 1C and 1D are cross-sectional views of various LED chips in the LED package of FIG. 1A.
Figure 1D:
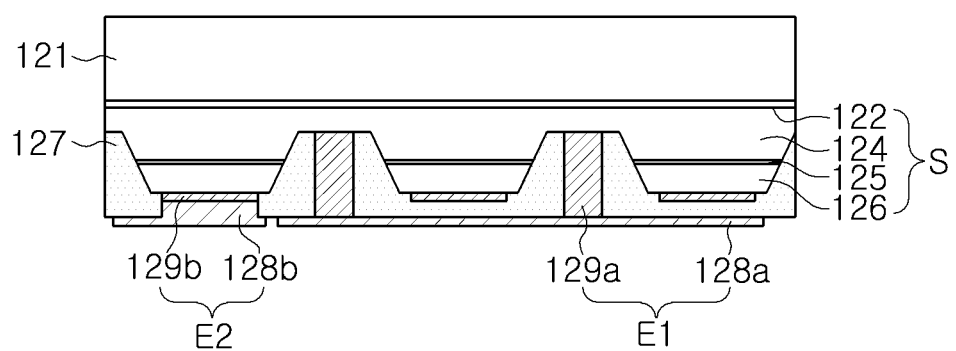

Hereinafter, the LED chip 120 according to an embodiment will be described with reference to FIGS. 1C and 1D. FIGS. 1C and 1D are cross-sectional views illustrating various LED chips 120A and 120B employable in the LED package 100A of FIG. 1A.

Referring to FIG. 1C, the LED chip 120A may include a chip substrate 121 and a semiconductor stack body S. The semiconductor stack body S may include a first conductivity-type semiconductor layer 124, an active layer 125, and a second conductivity-type semiconductor layer 126, sequentially disposed on the chip substrate 121. A buffer layer 122 may be disposed between the chip substrate 121 and the first conductivity-type semiconductor layer 124. In addition, first and second electrodes 129a and 129b may be further disposed on the first conductivity-type semiconductor layer 124 and the second conductivity-type semiconductor layer 126, respectively.

The chip substrate 121 may be an insulating substrate, e.g., sapphire. However, embodiments are not limited thereto, and the chip substrate 121 may be a conductive or semiconductor substrate, in addition to the insulating substrate. For example, the chip substrate 121 may be SiC, Si, $MgAl_2O_4$, MgO, $LiAlO_2$, $LiGaO_2$, or GaN, in addition to sapphire. An irregularity C may be formed on an upper surface of the chip substrate 121. The irregularity C may improve quality of a single crystal, grown while improving light extraction efficiency.

The buffer layer 122 may be $In_xAl_yGa_{1-x-y}N$ (where $0 \leq x \leq 1$, and $0 \leq y \leq 1$). For example, the buffer layer 122 may be GaN, AlN, AlGaN, or InGaN. The buffer layer 122 may be used by combining a plurality of layers or gradually changing some compositions.

The first conductivity-type semiconductor layer 124 may be a nitride semiconductor satisfying n-type $In_xAl_yGa_{1-x-y}N$ (where $0 \leq x < 1$, $0 \leq y < 1$, and $0 \leq x+y < 1$), and n-type impurities may be Si. For example, the first conductivity-type semiconductor layer 124 may include n-type GaN. The second conductivity-type semiconductor layer 126 may be a nitride semiconductor layer satisfying p-type $In_xAl_yGa_{1-x-y}N$ (where $0 \leq x < 1$, $0 \leq y < 1$, $0 \leq x+y < 1$), and p-type impurities may be Mg. For example, the second conductivity-type semiconductor layer 126 may be implemented as a single layer structure, but may have a multilayer structure having different compositions.

The active layer 125 may have a multiple quantum well (MQW) structure in which a quantum well layer and a quantum barrier layer are alternately stacked with each other. For example, the quantum well layer and the quantum barrier layer may be $In_xAl_yGa_{1-x-y}N$ (where $0 \leq x \leq 1$, $0 \leq y \leq 1$, and $0 \leq x+y \leq 1$) having different compositions. In an example, the quantum well layer may be $In_xGa_{1-x}N$ (where $0 < x \leq 1$), and the quantum barrier layer may be GaN or AlGaN. A thickness of the quantum well layer and a thickness of the quantum barrier layer may be in a range of 1 nm to 50 nm, respectively. The active layer 125 is not limited to the multiple quantum well structure, but may be a single quantum well structure.

The first and second electrodes 129a and 129b may be disposed on a mesa-etched region of the first conductivity-type semiconductor layer 124 and the second conductivity-type semiconductor layer 126, respectively, to be located on the same surface, e.g., of the chip substrate 121. The first and second electrodes 129a and 129b may be electrically connected to the pair of first wiring electrodes 111, respectively. The first electrode 129a is not limited thereto, but may include, e.g., Ag, Ni, Al, Cr, Rh, Pd, Ir, Ru, Mg, Zn, Pt, Au, or the like, and may be used as a structure of a single layer or two or more layers. The second electrode 129b may be a transparent electrode, e.g., a transparent conductive oxide or a transparent conductive nitride, or may include graphene. The second electrode 129b may include at least one of, e.g., Al, Au, Cr, Ni, Ti, or Sn.

Referring to FIG. 1D, similar to the embodiment of FIG. 1C, the LED chip 120B may include the chip substrate 121 and the semiconductor stack body S disposed on the chip substrate 121. The semiconductor stack body S may include the buffer layer 122, the first conductivity-type semiconductor layer 124, the active layer 125, and the second conductivity-type semiconductor layer 126. Further, the LED chip 120B may include first and second electrode structures E1 and E2 connected to the first and second conductivity-type semiconductor layers 124 and 126, respectively.

The first electrode structure E1 has a connection electrode 128a, e.g., a conductive via, passing through the second conductivity-type semiconductor layer 126 and the active layer 125, and connected to the first conductivity-type semiconductor layer 124, and the first electrode 129a connected to the connection electrode 128a. The connection electrode 128a may be surrounded by an insulating portion 127, to be electrically separated from the active layer 125 and the second conductivity-type semiconductor layer 126. The connection electrode 128a may be disposed in a region from which the semiconductor stack body S is etched. The number, shape, pitch, and contact area with the first conductivity-type semiconductor layer 124, or the like of the connection electrode 128a, may be appropriately designed to lower contact resistance. In addition, the connection electrodes 128a may be arranged to form rows and columns on the semiconductor stack body S, to improve current flow. The second electrode structure E2 may include an ohmic contact layer 128b and the second electrode 129b, disposed on the second conductivity-type semiconductor layer 126.

The connection electrode 128a and the ohmic contact layer 128b may include a conductive material having ohmic characteristics for the first and second conductivity-type semiconductor layers 124 and 126, respectively, in a single-layer or multi-layer structure, and may include, e.g., Ag, Al, Ni, Cr, a transparent conductive oxide (TCO), or the like.

The first and second electrodes 129a and 129b may be respectively connected to the connection electrode 128a and the ohmic contact layer 128b to function as external terminals of the LED chip 120B. For example, the first and second electrodes 129a and 129b may be Au, Ag, Al, Ti, W, Cu, Sn, Ni, Pt, Cr, NiSn, TiW, AuSn, or eutectic metals thereof. The first and second electrode structures E1 and E2 may be disposed in the same direction. The first and second electrode structures E1 and E2 may be electrically connected to the pair of first wiring electrodes 111, respectively.

Again, referring to FIGS. 1A and 1B, the wavelength conversion film 130 may be disposed, e.g., directly, on the LED chip 120, and a lateral surface of the wavelength conversion film 130 may be surrounded by the lateral structure 160. A light emission region of the LED package 100A may be provided by the wavelength conversion film 130, and may be defined by the lateral structure 160. The wavelength conversion film 130 may include at least one type of wavelength conversion material converting portion of light emitted from the LED chip 120 into light having a first wavelength, different from the emitted wavelength. The wavelength conversion film 130 may be a resin layer or a ceramic phosphor film in which a wavelength conversion material is dispersed. For example, the wavelength conversion material may be at least one of a phosphor or a quantum dot. In an embodiment, the LED chip 120 may be a flash LED emitting blue light. For example, the LED chip 120 may emit light having a dominant wavelength ranging from 440 nm to 460 nm. In this case, the wavelength conversion material in the wavelength conversion film 130 may include a phosphor or a quantum dot, converting portion of blue light to yellow light, or include a plurality of phosphors or a plurality of quantum dots, converting portion of blue light to red and green light.

The optical lens 140 may be disposed, e.g., directly, on an upper surface or a lower surface of the electrochromic film 150, and may condense or expand light passed through the wavelength conversion film 130, to emit the light to an external space of the LED package 100A. In an embodiment, the optical lens 140 may be disposed on the upper surface of the electrochromic film 150, and at least a portion of a lateral surface of the optical lens 140 may be covered by a color layer 162 of the lateral structure 160. In an example, an upper surface of the optical lens 140 may be coplanar with an upper surface of the color layer 162 or an upper surface of the lateral structure 160. The optical lens 140 may include, e.g., at least one of a diffractive optic elements (DOE) lens, a microlens array (MLA) lens, a Fresnel lens, a flat lens, a meta lens, and the like. The optical lens 140 may include any polymer material, e.g., at least one of acrylic, polymethyl methacrylate (PMMA), polyvinyl chloride (PVC), polycarbonate (PC), epoxy, high-density polyethylene (HDPE), or silicone, and a glass material, e.g., fused silica, but is not limited thereto.

Figure 1E:
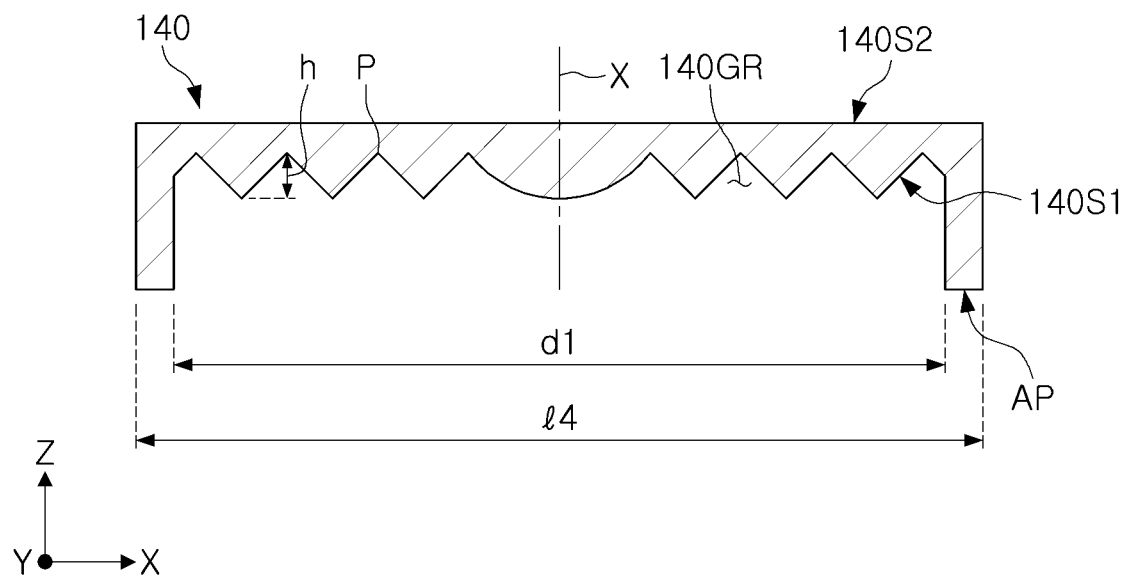
FIG. 1E is an enlarged cross-sectional view of the optical lens of FIG. 1A.

Hereinafter, the optical lens 140 according to an embodiment will be described with reference to FIG. 1E along with FIGS. 1A and 1B. FIG. 1E is an enlarged cross-sectional view of the optical lens 140 of FIG. 1A. An internal vertex P in a plurality of grooves 140GR of FIG. 1E is illustrated by broken lines in FIG. 1B.

Referring to FIGS. 1A, 1B, and 1E, the optical lens 140 may have a plurality of grooves 140GR etched on one surface of a light-transmitting sheet (e.g., a plastic sheet). The optical lens 140 may be disposed to oppose the plurality of grooves 140GR and the wavelength conversion film 130, but may be disposed in a direction, opposite thereto. The plurality of grooves 140GR may be considered as a plurality of individual lenses having the same focus. The optical lens 140 may adjust a light distribution pattern of light refracted from the LED package 100A. For example, brightness of the refracted light in a central portion may decrease and a divergence angle of the refracted light may increase (e.g., 100° or more), or the brightness of the refracted light in the central portion may increase and the divergence angle of the refracted light may decrease (e.g., 50° or less).

In an embodiment, the optical lens 140 may have a first surface 140S1 facing the wavelength conversion film 130 and the electrochromic film 150, and a second surface 140S2 opposing the first surface 140S1 and having a substantially planar surface. The first surface 140S1 may have the plurality of grooves 140GR recessed toward the second surface 140S2. The first surface 140S1 may be a surface of a Fresnel lens, facing the wavelength conversion film 130. The Fresnel lens may be an optical lens composed of continuous concentric grooves, and may bend parallel rays by a general focal length. The Fresnel lens may be used as a condensing lens, a magnifying glass, or a projection lens.

The optical lens 140 may include an adhesive portion AP partially contacting the upper or lower surface of the electrochromic film 150 or an upper surface of the wavelength conversion film 130. In an example, the adhesive portion AP of the optical lens 140 may extend along an edge of the optical lens 140. The adhesive portion AP may be spaced farther from the second surface 140S2, e.g., the adhesive portion AP may extend beyond the second surface 140S2, as compared to a protrusion between the plurality of grooves 140GR. Therefore, an air gap AG may be formed between the first surface 140S1 and the electrochromic film 150 or the wavelength conversion film 130. The first surface 140S1 of the optical lens 140 may be rotationally symmetric with respect to a central axis X parallel to the Z axis, and a diameter d1 of the air gap AG, e.g., measured between facing surfaces of the adhesive portion AP, may be smaller than the length $\ell 4$ of the optical lens 140 in the horizontal direction (the X-axis direction).

In an embodiment, the length $\ell 4$ of the optical lens 140 in the horizontal direction (the X-axis direction) may be longer than the length $\ell 2$ of the LED chip 120 in the horizontal direction (the X-axis direction), and may be shorter than each of the length $\ell 3$ of the wavelength conversion film 130 and of the length $\ell 5$ of the electrochromic film 150 in the horizontal direction (the X-axis direction), respectively. In an example, a height h of each of the plurality of grooves 140GR may be in a range of about 35 μm to about 65 μm, but embodiments are not limited thereto. In an example, the optical lens 140 may have an ultra-thin film shape in which the height h of each of the plurality of grooves 140GR is 1 μm or less.

The electrochromic film 150 may be disposed, e.g., directly, on the wavelength conversion film 130, and may be electrically connected to the pair of second wiring electrodes 112 of the substrate 110. The electrochromic film 150 may have a predetermined color before application of a voltage, and converted to be transparent after application of the voltage. In addition, the electrochromic film 150 may be in an opaque state before application of a voltage. The electrochromic film 150 may include an electrochromic material. The electrochromic material may change color reversibly by oxidation-reduction reactions, caused by a voltage. The electrochromic material may control not only color but also transmittance by a voltage, to secure visibility. For example, the electrochromic material may include a reductive colorant material containing an inorganic metal oxide, e.g., tungsten trioxide ($WO_3$), titanium dioxide ($TiO_2$), or niobium pentoxide ($Nb_2O_5$), and an organic polymer material, e.g., polyaniline, polythiophene, polybiorgen, or polypyrrole, and an oxidative colorant material, e.g., iridium oxide ($IrO_2$).

The electrochromic film 150 may include an electrode capable of applying a voltage to a color change layer made of an electrochromic material. The electrode of the electrochromic film 150 may be variously designed in consideration of an area of the electrochromic film 150 and reaction time of the electrochromic material. The electrode of the electrochromic film 150 may be electrically connected to the pair of second wiring electrodes 112 of the substrate 110 through a connection member W, e.g., a bonding wire, a flexible electrode, or the like. The electrochromic film 150 may operate independently of the LED chip 120. The electrochromic film 150 may maintain an opaque state (a state in which a voltage is not applied) in an operation-ready state of the LED chip 120, and may be switched into a transparent state (a state in which a voltage is applied) in an operation state (light emission) of the LED chip 120. The operation-ready state of the LED chip 120 may be, e.g., a state in which an application capable of operating the LED chip 120 (e.g., a camera application, a flashlight application, or the like) is executed, and no operation command of the LED chip 120 has been issued. Therefore, the electrochromic film 150 may prevent a color (e.g., yellow) of the wavelength conversion film 130 from being exposed to an exterior of the LED package 100A, e.g., when in the opaque state. In addition, since the electrochromic film 150 has a predetermined color before application of a voltage, a color of the electrochromic film 150 and a color of the color layer 162 of the lateral structure 160 may be combined to design variously an appearance of the LED package 100A.

For example, before application of a voltage, the electrochromic film 150 may have a light transmittance (e.g., transmittance to visible light) of less than about 50%, and may be opaque, or may be black or have a predetermined color. In addition, before application of a voltage, a color of the electrochromic film 150 may be substantially the same as a color of the color layer 162. In this case, the same color may not refer to the exact same color physically and optically, but may refer to the degree to which the same color is recognized in terms of a design of an appearance. The electrochromic film 150 may have a light transmittance of about 80% or more after application of a voltage. Therefore, the electrochromic film 150 may provide an emission path of light generated from the LED chip 120 after application of a voltage.

In an embodiment, the width $\ell 5$ of the electrochromic film 150 may be larger than the width $\ell 4$ of the optical lens 140, and the edge region of the electrochromic film 150 may partially overlap the color layer 162 in a vertical direction (OL1). Therefore, the electrochromic film 150 may prevent the wavelength conversion film 130 from being exposed through the optical lens 140. The width $\ell 5$ of the electrochromic film 150 may be substantially the same as the width $\ell 3$ of the wavelength conversion film 130, e.g., the electrochromic film 150 and the wavelength conversion film 130 may completely overlap each other in a top view.

The lateral structure 160 may include the reflective layer 161 covering at least a portion of a lateral surface of the LED chip 120, and the color layer 162 disposed on the wavelength conversion film 130, and having a predetermined color. The reflective layer 161 may surround a lateral surface of each of the LED chip 120 and the wavelength conversion film 130, and may define a light emission region. The reflective layer 161 may include a resin body containing reflective powder. For example, the resin body may include silicone or epoxy resin. The reflective powder may be white ceramic powder or metal powder. For example, the ceramic powder may be at least one of $TiO_2$, $Al_2O_3$, $Nb_2O_5$, and ZnO. The metal powder may be, e.g., Al or Ag. The reflective layer 161 may be formed to be higher than a height of an upper surface of the wavelength conversion film 130, e.g., a top surface of the reflective layer 161 may be higher than a top surface of the conversion film 130 relative to the substrate 110, to improve efficiency of condensing light onto the optical lens 140.

The color layer 162 may include, e.g., a toning agent, a colorant, a pigment, or the like, representing a predetermined color in the epoxy resin. The color layer 162 may be disposed on the reflective layer 161 to prevent exposure of the wavelength conversion film 130 or the like to an exterior, e.g., from an appearance, of the LED package 100A. An upper surface of the color layer 162 may be coplanar with an upper surface of the optical lens 140, e.g., the color layer 162 may directly contact and completely surround a perimeter of the optical lens 140. A thickness of the color layer 162 may be adjusted to represent a color and a density, necessary for appearance. The color of the color layer 162 may be designed to match the color of the electrochromic film 150 before voltage is applied and a color of an exterior of an electronic device in which the LED package 100A is employed. For example, the color of the color layer 162 may be substantially the same as the color of the electrochromic film 150 before application of a voltage, and the color of the exterior of the electronic device in which the LED package 100A is employed. The color of the color layer 162, the color of the electrochromic film 150, and the color of the exterior of the electronic device are not limited to the same color, and may have different colors, depending on a design.

Figure 2:
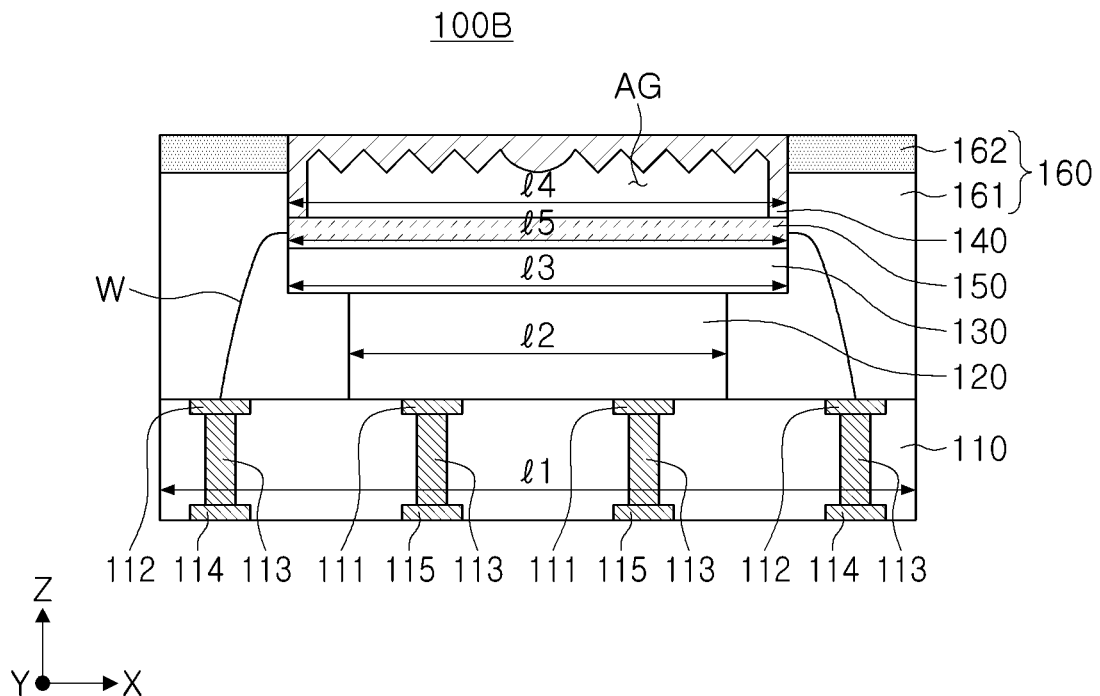
FIG. 2 is a cross-sectional view of an LED package according to an embodiment.

FIG. 2 is a cross-sectional view illustrating an LED package 100B according to an embodiment. In FIG. 2, components having the same reference numerals as those of FIG. 1A may have the same or similar features as those described above, and overlapped descriptions thereof may be thus omitted.

Referring to FIG. 2, in the LED package 100B, a length or width $\ell 4$ of the optical lens 140 may be substantially the same as at least one of the width $\ell 3$ of the wavelength conversion film 130 and the width $\ell 5$ of the electrochromic film 150, in the horizontal direction (the X-axis direction), respectively. In an embodiment, the optical lens 140 may be in contact with an upper surface of the electrochromic film 150, and the width $\ell 4$ of the optical lens 140 may be substantially the same as the width $\ell 3$ of the wavelength conversion film 130 and the width of $\ell 5$ of the electrochromic film 150. An overlapping region ("OL1" in FIG. 1A) of the electrochromic film 150 and a color layer 162 may not be formed. The optical lens 140 may be formed to entirely cover light emitting regions defined by the wavelength conversion film 130. In addition, since a diameter of an air gap between the optical lens 140 and the electrochromic film 150 increases together with the width $\ell 4$ of the optical lens 140, the number of grooves 140GR of the optical lens 140 may increase.

Figure 3:
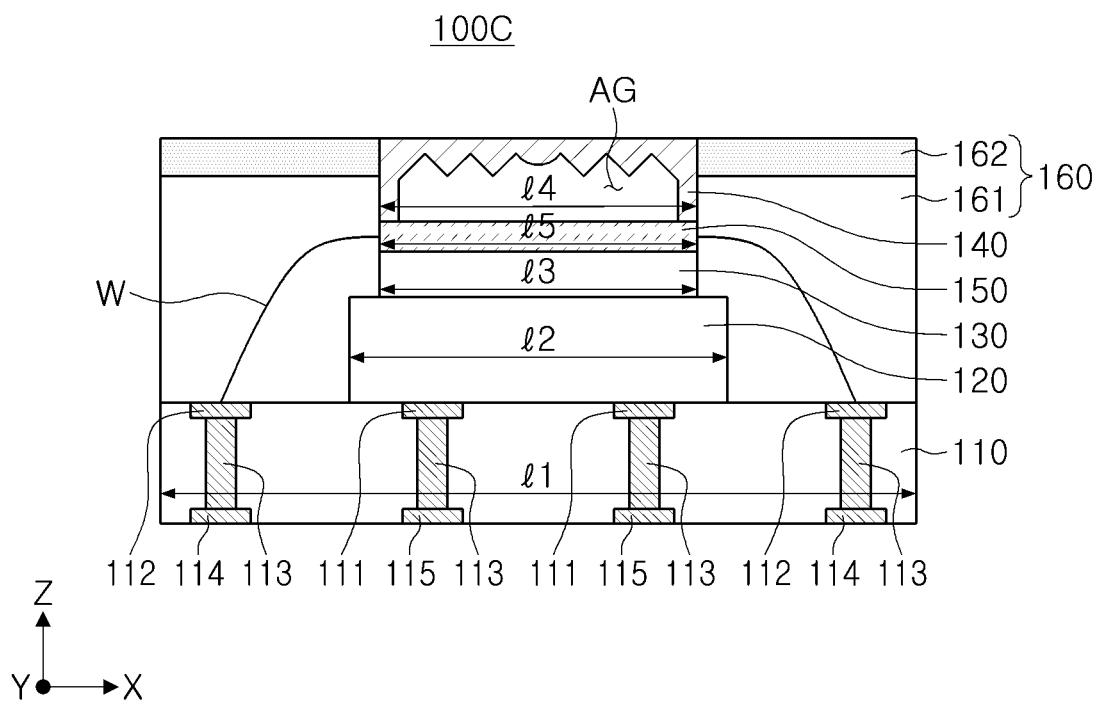
FIG. 3 is a cross-sectional view of an LED package according to an embodiment.

FIG. 3 is a cross-sectional view illustrating an LED package 100C according to an embodiment. In FIG. 3, components having the same reference numerals as those of FIG. 1A may have the same or similar features as those described above, and overlapped descriptions thereof may be thus omitted.

Referring to FIG. 3, in the LED package 100C, a length or width of at least one of the wavelength conversion film 130, the optical lens 140, or the electrochromic film 150 may be less than the width $\ell 2$ of an LED chip 120, in the horizontal direction (the X-axis direction). In an embodiment, the width $\ell 3$ of the wavelength conversion film 130, the width $\ell 4$ of the optical lens 140, and the width $\ell 5$ of the electrochromic film 150 may be less than the width $\ell 2$ of the LED chip 120, respectively. the reflective layer 161 of the lateral structure 160 may cover a lateral surface of the wavelength conversion film 130, a lateral surface of the optical lens 140, a lateral surface of the electrochromic film 150, and at least a portion of an upper surface of the LED chip 120. Therefore, brightness of refracted light in a central portion of the refracted light and reach distance of the refracted light of the LED package 100C may increase. In addition, the optical lens 140 may be miniaturized according to a design of an exterior of an electronic device in which the LED package 100C is employed. In the drawings, the width $\ell 3$ of the wavelength conversion film 130, the width $\ell 4$ of the optical lens 140, and the width $\ell 5$ of the electrochromic film 150 are illustrated to have the same value, but are not limited thereto, and may have different values.

Figure 4:
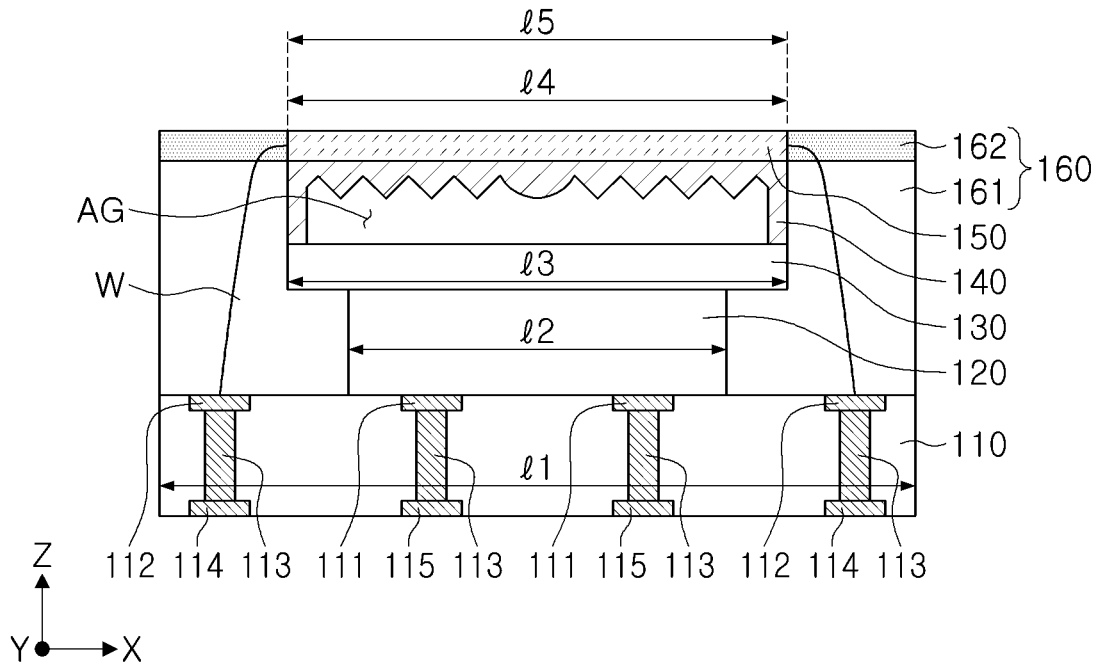
FIG. 4 is a cross-sectional view of an LED package according to an embodiment.

FIG. 4 is a cross-sectional view illustrating an LED package 100D according to an embodiment. In FIG. 4, components having the same reference numerals as those of FIG. 1A may have the same or similar features as those described above, and overlapped descriptions thereof may be thus omitted.

Referring to FIG. 4, in the LED package 100D, the electrochromic film 150 may be disposed on the optical lens 140 and exposed from an uppermost side of the LED package 100D. In an embodiment, the optical lens 140 may be disposed on a lower surface of the electrochromic film 150, and the color layer 162 may cover at least a portion of a lateral surface of the electrochromic film 150. An upper surface of the electrochromic film 150 may be coplanar with an upper surface of the color layer 162. In an example, the electrochromic film 150 may have the width $\ell 5$ substantially the same as the width $\ell 4$ of the optical lens 140, to cover the optical lens 140, but is not limited thereto. Since the electrochromic film 150 may be located on the same height level as the color layer 162, even when the width $\ell 5$ of the electrochromic film 150 is less than the width $\ell 4$ of the optical lens 140, the optical lens 140 or a wavelength conversion film 130 may not be exposed from an appearance of the LED package 100D. The optical lens 140 may be disposed to face a Fresnel surface toward the wavelength conversion film 130, but may be disposed to face the Fresnel surface toward the electrochromic film 150.

Figure 5A:
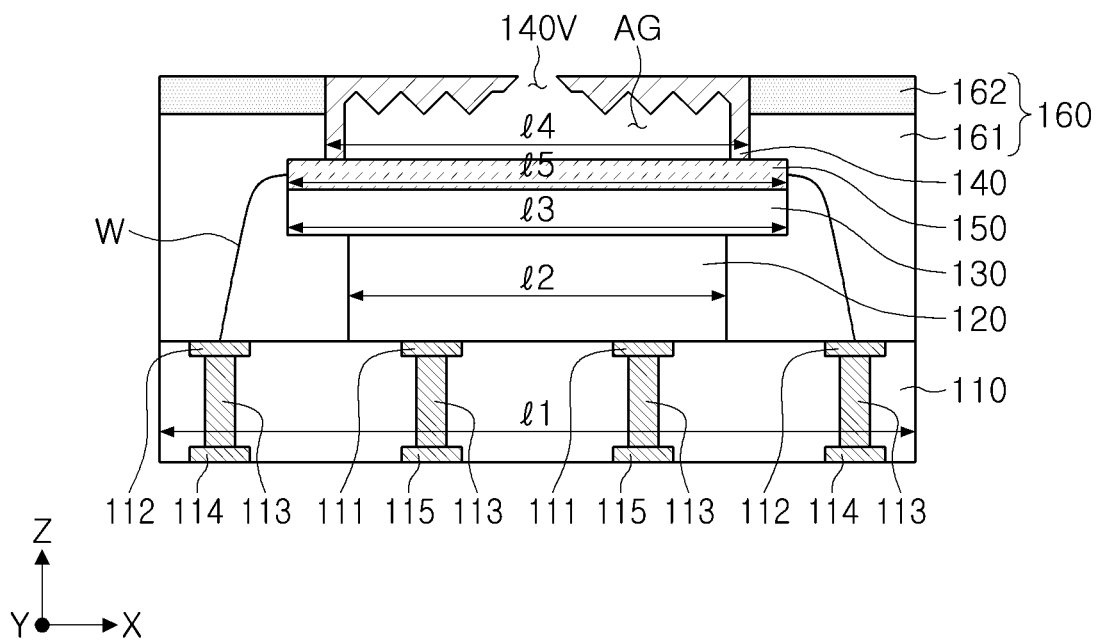
FIG. 5A is a cross-sectional view of an LED package according to an embodiment.
Figure 5B:
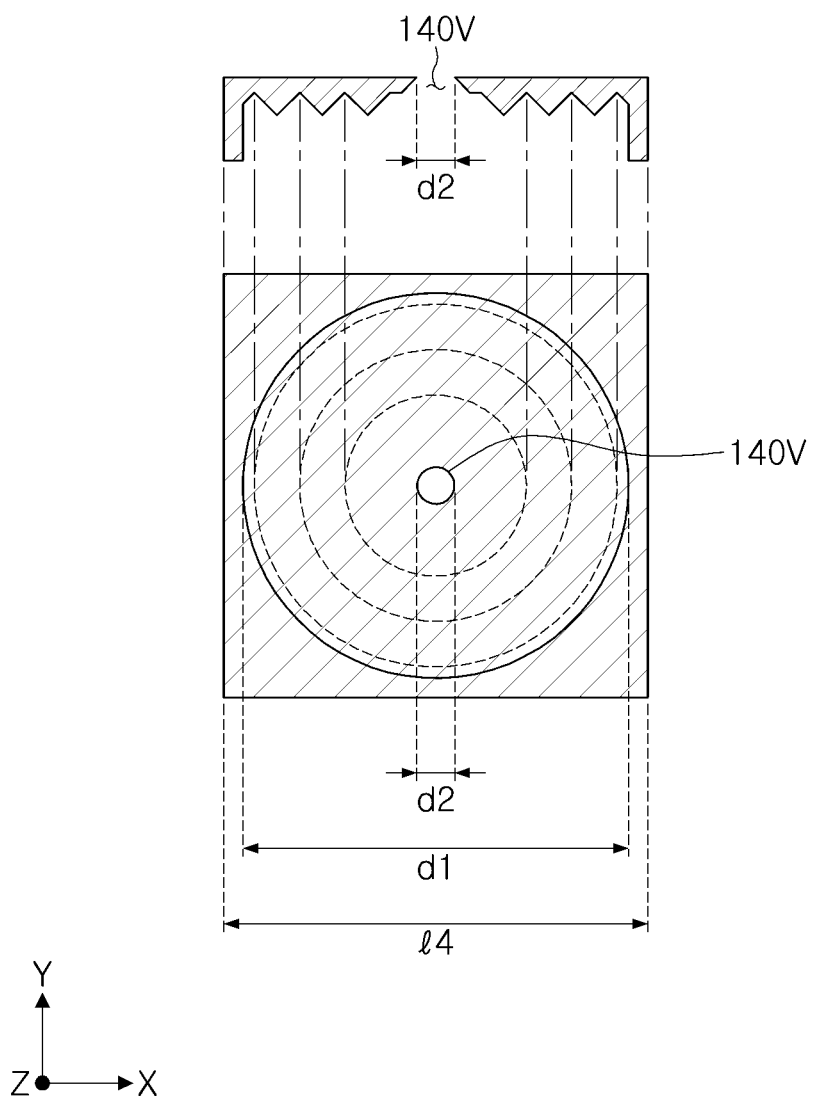
FIG. 5B is an enlarged cross-sectional view of the optical lens of FIG. 5A.

FIG. 5A is a cross-sectional view illustrating an LED package 100E according to an embodiment, and FIG. 5B is an enlarged cross-sectional view of the optical lens 140 of FIG. 5A. In FIGS. 5A and 5B, components having the same reference numerals as those of FIGS. 1A and 1E may have the same or similar features as those described above, and overlapped descriptions thereof may be thus omitted.

Referring to FIGS. 5A and 5B, the LED package 100E may include the optical lens 140 having a vent hole 140V penetrating from the first surface 140S1 to the second surface 140S2 and communicating with the air gap AG. In an embodiment, the vent hole 140V may be formed in a central portion of the optical lens 140. Therefore, the optical lens 140 and the electrochromic film 150 may be prevented from being separated from each other in a process of manufacturing the LED package 100E. In an example, a planar shape of the vent hole 140V may be circular, but is not limited thereto. For example, the planar shape of the vent hole 140V may be a square. In an example, the vent hole 140V may have a shape in which a diameter d2 decreases as it approaches the second surface 140S2, but is not limited thereto. In an example, a diameter d2 of the vent hole 140V on the same surface as the second surface 140S2 may be in a range of about 50 μm to about 100 μm. Particles having a diameter of about 100 μm or less may not substantially deteriorate light emitting characteristics of the LED package 100E, even when introduced into the air gap AG through the vent hole 140V.

Figure 6A:
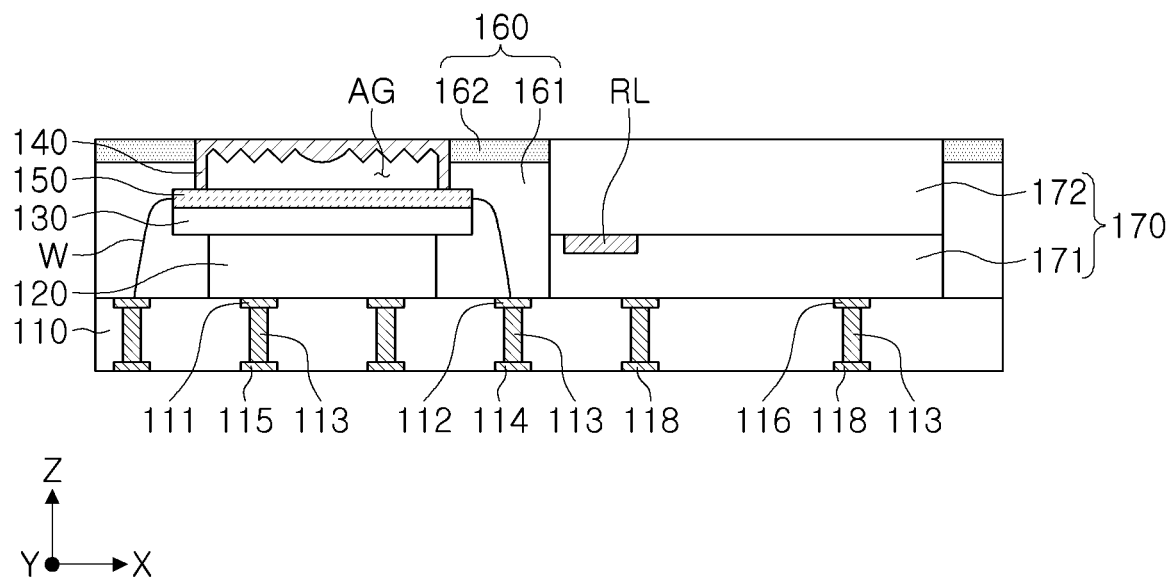
FIG. 6A is a cross-sectional view of an LED package according to an embodiment.
Figure 6B:
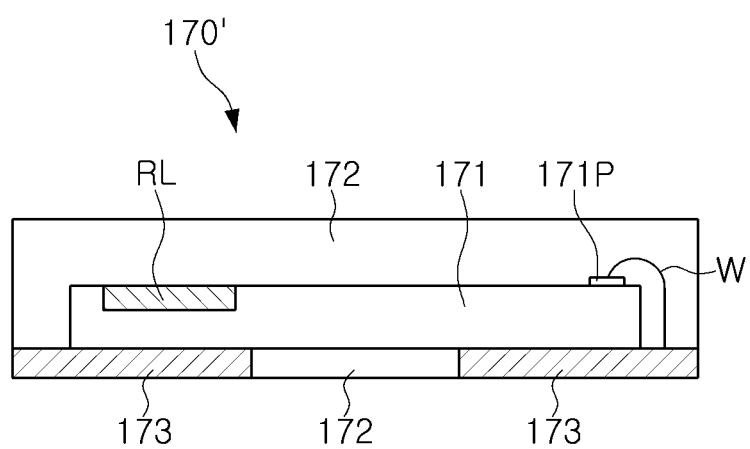
Figure 6C:
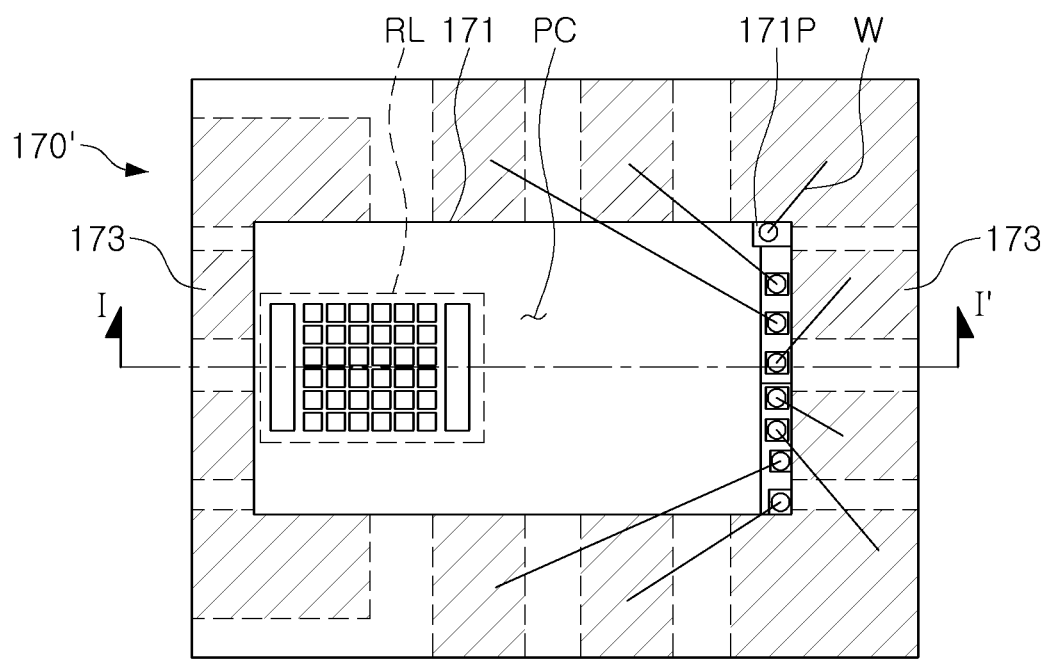
FIG. 6C is a plan view of the optical sensor illustrated in FIG. 6B.

FIG. 6A is a cross-sectional view illustrating an LED package 100F according to an embodiment, FIG. 6B is a cross-sectional view of a modified optical sensor in the LED package of FIG. 6A, and FIG. 6C is a plan view of the optical sensor in FIG. 6B. FIG. 6B is a cross-sectional view along line I-I' of FIG. 6C. In FIGS. 6A to 6C, components having the same reference numerals as those of FIG. 1A may have the same or similar features as those described above, and overlapped descriptions thereof may be thus omitted.

Referring to FIG. 6A, the LED package 100F further may include an optical sensor 170 including a sensor chip 171 disposed on the substrate 110 and having a light receiving region RL, and a transparent protective layer 172. The optical sensor 170 may be electrically connected to a circuit of the substrate 110. The sensor chip 171 may include a plurality of terminals electrically connected to a terminal of the substrate 110. For example, the optical sensor 170 may be mounted on the substrate 110 by a flip-chip method, to be electrically connected to a third wiring electrode 116. In an example, the third wiring electrode 116 may be electrically connected to a third external wiring electrode 118 through the wiring via 113. The LED package 100F may be mounted on an external substrate, and may transmit a signal of the optical sensor 170 externally through the third external wiring electrode 118. Alternatively, according to various forms of the optical sensor 170, the optical sensor 170 may be mounted on the substrate 110 by a wire-bonding method. The light receiving region RL may be disposed on one side of an upper surface of the sensor chip 171. The light receiving region RL may include a photodiode array. The transparent protective layer 172 may include an insulating material, e.g., an epoxy resin.

In an embodiment, the optical sensor 170 has the light receiving region RL for receiving ambient light, and the light receiving region RL may be disposed adjacent to the LED chip 120, e.g., along the X-axis. As an example, when a camera of an electronic device operates, light emitted from the LED chip 120 may be used as illumination in a dark environment, and a camera image may be corrected using ambient light information of the optical sensor 170. The optical sensor 170 may be spaced apart from the LED chip 120 or the like by the reflective layer 161. In an embodiment, a lateral surface of the optical sensor 170 may be covered by the reflective layer 161. The reflective layer 161 may prevent light emitted from the LED chip 120 from traveling to the optical sensor 170. An upper surface of the optical sensor 170 may be exposed by the color layer 162. In an example, the upper surface of the optical sensor 170 may be coplanar with an upper surface of the color layer 162.

Referring to FIGS. 6B and 6C, in an example, an optical sensor 170' may include a lead frame 173, the optical sensor chip 171 disposed on the lead frame 173, and the transparent protective layer 172 disposed on the lead frame 173 and encapsulating the optical sensor chip 171. The optical sensor chip 171 may include a plurality of terminals 171P, and each of the plurality of terminals 171P may be connected to the lead frame 173 by the connection member W. In addition, on an upper surface of the optical sensor chip 171, the light receiving region RL adjacent to one edge thereof and a peripheral circuit region PC, which may be a region other than the light receiving region RL, may be disposed. The light receiving region RL may include a plurality of photodiode cells and may sense light of various wavelength bands. For example, the light receiving region RL may include a first region for detecting light in a visible band, a second region for detecting flickering, and a third region for detecting infrared rays. The peripheral circuit region PC may include a circuit device, e.g., a transistor. In an example, the lead frame 173 may be electrically connected to the third wiring electrode 116 illustrated in FIG. 6A in a direct contact manner or through a connection member, e.g., a solder ball.

Figure 7A:
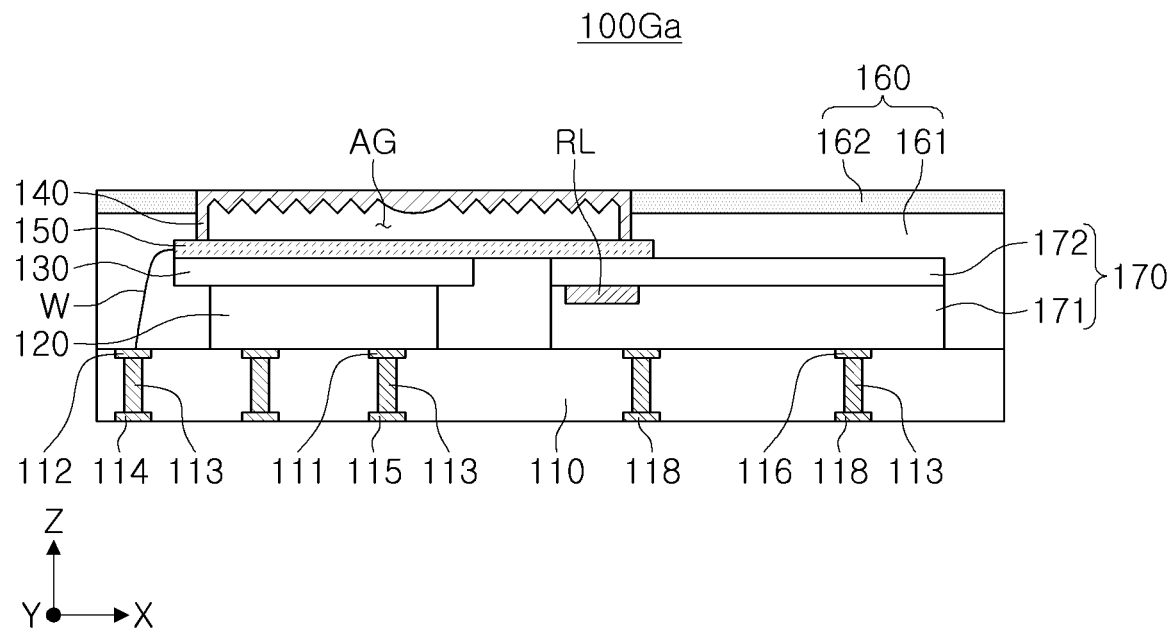
FIGS. 7A and 7B are cross-sectional views of an LED package according to an embodiment.
Figure 7B:
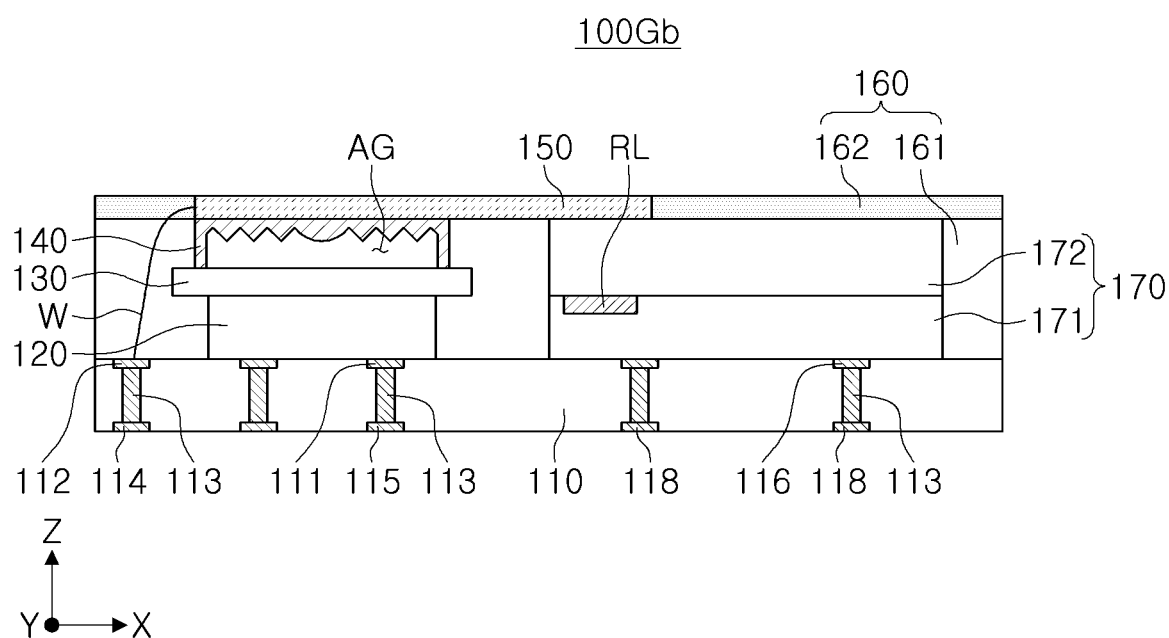

FIGS. 7A and 7B are cross-sectional views, respectively, illustrating LED packages 100Ga and 100Gb according to an embodiment. In FIGS. 7A and 7B, components having the same reference numerals as those of FIGS. 1A and 6A may have the same or similar features as those described above, and overlapped descriptions thereof may be thus omitted. Referring to FIGS. 7A and 7B, although only a single wiring electrode 112 is illustrated, the electrochromic film 150 and additional second wiring electrodes may be connected to each other.

Referring to FIGS. 7A and 7B, in the LED packages 100Ga and 100Gb, the light receiving region RL of the optical sensor 170 may be covered by the electrochromic film 150, and a remaining portion of the optical sensor 170 not covered by the electrochromic film 150 may be covered by the color layer 162. In an example, the light receiving region RL of the optical sensor 170 may overlap at least a portion of the electrochromic film 150 in the vertical direction (the Z-axis direction). Therefore, when no voltage is applied, the light receiving region RL of the optical sensor 170 may not be exposed from an appearance of each of the LED packages 100Ga and 100Gb.

In an embodiment, the optical lens 140 may be disposed on an upper surface of the electrochromic film 150, and the optical lens 140 and the electrochromic film 150 may cover at least portion of the wavelength conversion film 130 and at least portion of the light receiving region RL. The optical lens 140 and the electrochromic film 150 may have widths $\ell 4$ and $\ell 5$, capable of covering both the wavelength conversion film 130 and the light receiving region RL, respectively. Therefore, before application of a voltage, the wavelength conversion film 130 and the light receiving region RL may not be exposed in appearance, and the appearance of the LED package 100Ga may be expressed by a color of the electrochromic film 150 and a color of the color layer 162.

In an embodiment, the optical lens 140 may be disposed on a lower surface of the electrochromic film 150, and the electrochromic film 150 may cover at least portion of the wavelength conversion film 130 and at least portion of the light receiving region RL. The electrochromic film 150 may have the width $\ell 5$ capable of covering both the wavelength conversion film 130 and the light receiving region RL. Therefore, before application of a voltage, the wavelength conversion film 130 and the light receiving region RL may not be exposed in appearance, and the appearance of the LED package 100Gb may be expressed by a color of the electrochromic film 150 and a color of the color layer 162.

Figure 8:
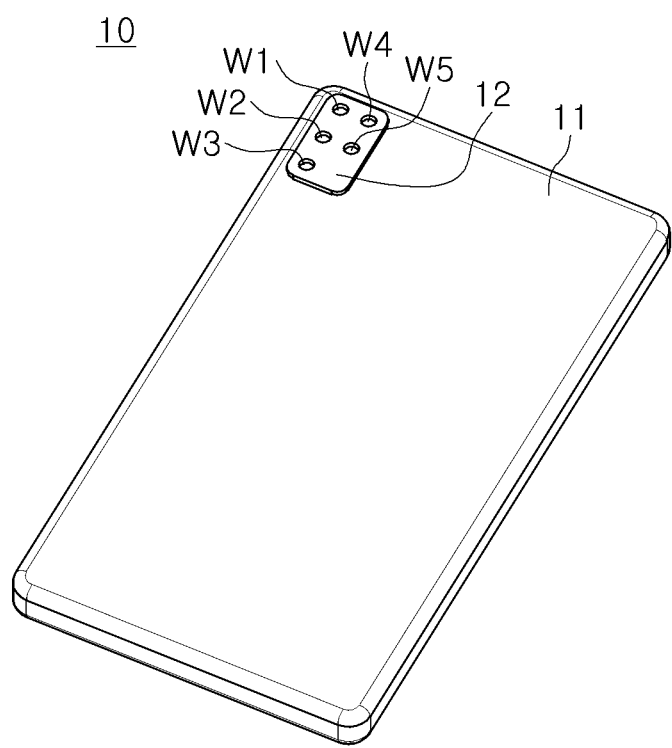
FIG. 8 is a perspective view of an electronic device including an LED package according to various embodiments.

FIG. 8 is a perspective view illustrating an electronic device 10 in which an

Figure 9A:
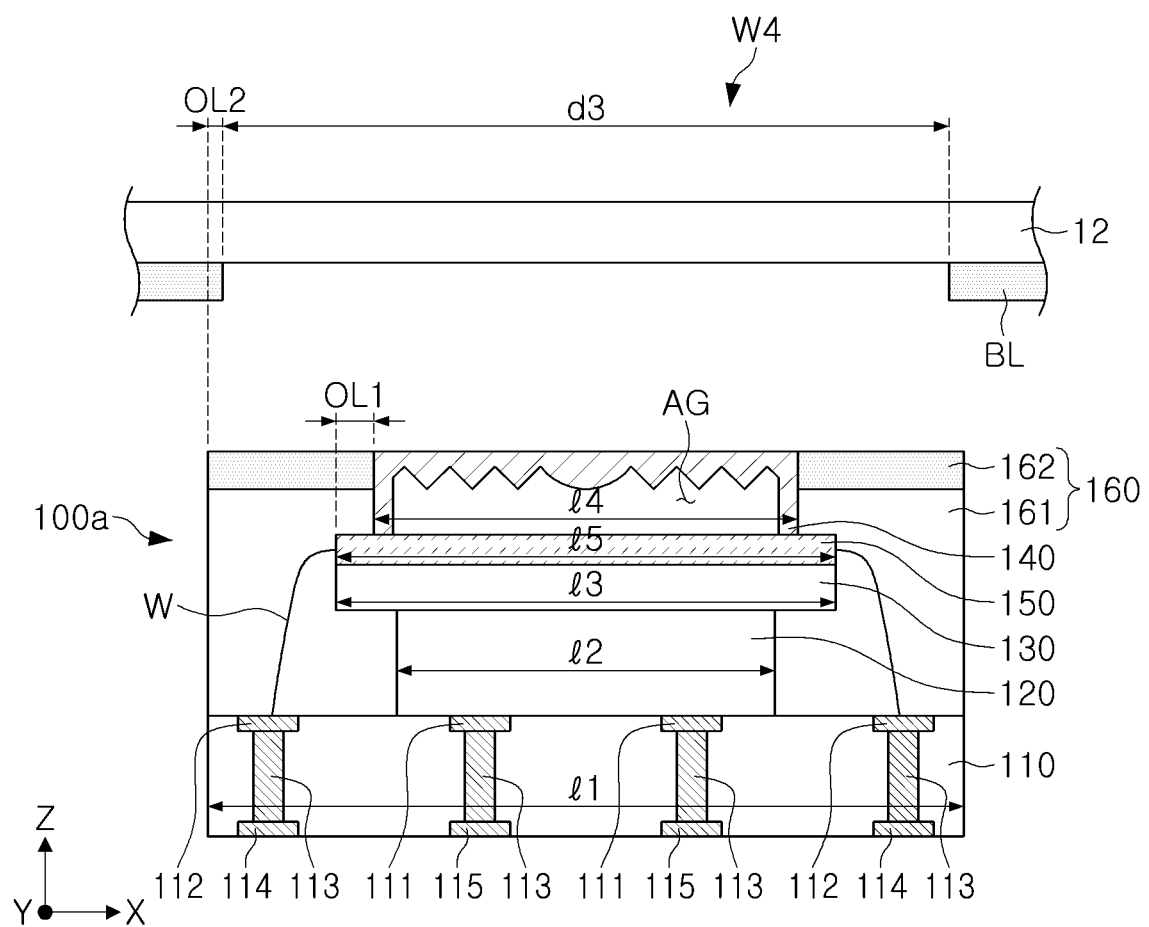
FIGS. 9A and 9B are cross-sectional views of a combined state of components of an electronic device and an LED package according to an embodiment, respectively.
Figure 9B:
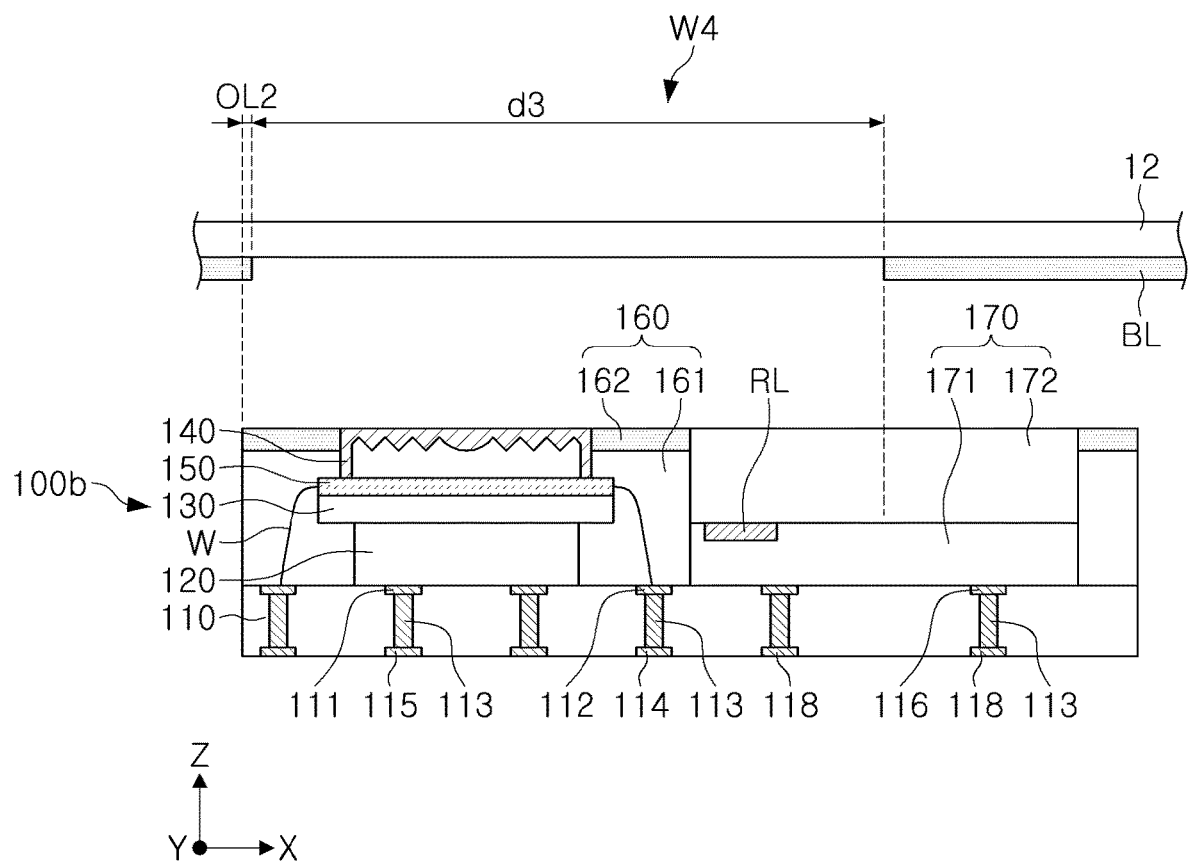

LED package according to various embodiments may be employed, and FIGS. 9A and 9B are cross-sectional views illustrating a combined state of a transparent cover 12 of the electronic device 10 and LED packages 100a and 100b, according to an embodiment, respectively.

First, referring to FIG. 8, the electronic device 10 may be a cellular phone, e.g., a smartphone. However, this is illustrative, and the electronic device 10 may be any electronic device including an optical window for an optical device (e.g., an illumination, an optical sensor, a camera, or the like) such as a laptop, a desktop, a monitor, a tablet, a digital camera, or the like. The electronic device 10 may include a set cover 11 and a transparent cover 12 disposed on one side of the set cover 11 and including a plurality of optical windows W1, W2, W3, W4, and W5. In an example, the optical windows W1, W2, W3, W4, and W5 may provide an optical path for a camera module, a flash module, or the like, mounted in the electronic device 10. For example, the optical window W1 may provide an optical path for a super wide angle camera, the optical window W2 may provide an optical path for a wide angle camera, and the optical window W3 may provide an optical path for a telephoto camera. The optical window W4 may provide an optical path for an LED package. The optical window W5 may provide an optical path for an ambient optical sensor, e.g., an IR sensor or the like.

Referring to FIGS. 9A and 8 together, an LED package 100a according to an embodiment may be disposed in the set cover 11 to emit light through the optical window W4. The LED package 100a may have various shapes according to embodiments. For example, the LED package 100a may have the forms of the embodiments illustrated in FIGS. 1A, 2, 3, 4, and 5A. The LED package 100a may be disposed below the optical window W4 formed on the transparent cover 12. The transparent cover 12 may be a transparent substrate, e.g., glass, but is not limited thereto. A light blocking layer BL disposed on one surface (e.g., a lower surface) of the transparent cover 12 may be provided. The light blocking layer BL may block transmittance of light to a remaining portion except for the optical window W4. In addition, the light blocking layer BL may have a predetermined color. In an example, a color of the light blocking layer BL may be substantially the same as a color of the set cover 11, but is not limited thereto, and may have various colors depending on a design. A diameter d3 of the optical window W4 may be smaller than a width ℓ1 of the LED package 100a or the substrate 110. Therefore, the light blocking layer BL may partially overlap the LED package 100a. In an example, the color layer 162 of the LED package 100a may have a region OL2 partially overlapping the light blocking layer BL in the vertical direction (the Z-axis direction). Therefore, an exterior of the electronic device 10 before application of a voltage to the electrochromic film 150 of the LED package 100a may be expressed by a color of the set cover 11, a color of the light blocking layer BL, a color of the color layer 162, and a color of the electrochromic film 150. In an example, the color of the set cover 11, the color of the light blocking layer BL, the color of the color layer 162, and the color of the electrochromic film 150 before application of a voltage may be substantially the same color.

Referring to FIGS. 9B and 8 together, an LED package 100b according to an embodiment may further include the optical sensor 170 receiving ambient light through the optical window W4. The LED package 100b may have various shapes according to embodiments. For example, the LED package 100b may have the form of the embodiments illustrated in FIGS. 6A, 7A, and 7B. The light receiving region RL of the optical sensor 170 may be disposed in the optical window W4. The optical sensor 170 may receive ambient light through the optical window W4 providing an optical path of a flash module. In this case, the optical window W5 of FIG. 8 may be omitted.

Figure 10A:
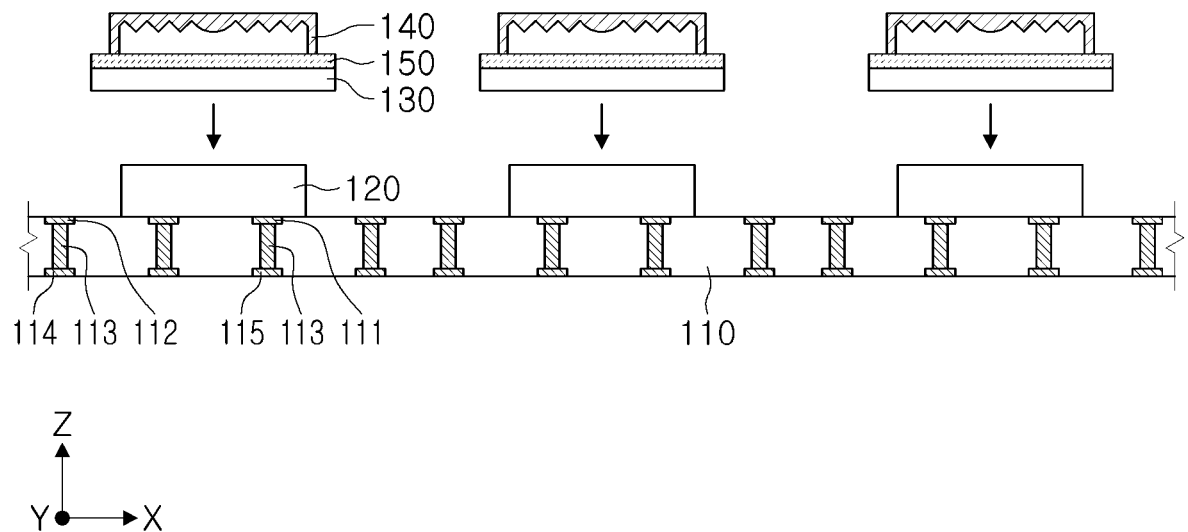
FIGS. 10A to 10C are cross-sectional views of stages in a method of manufacturing the LED package of FIG. 1A.
Figure 10B:
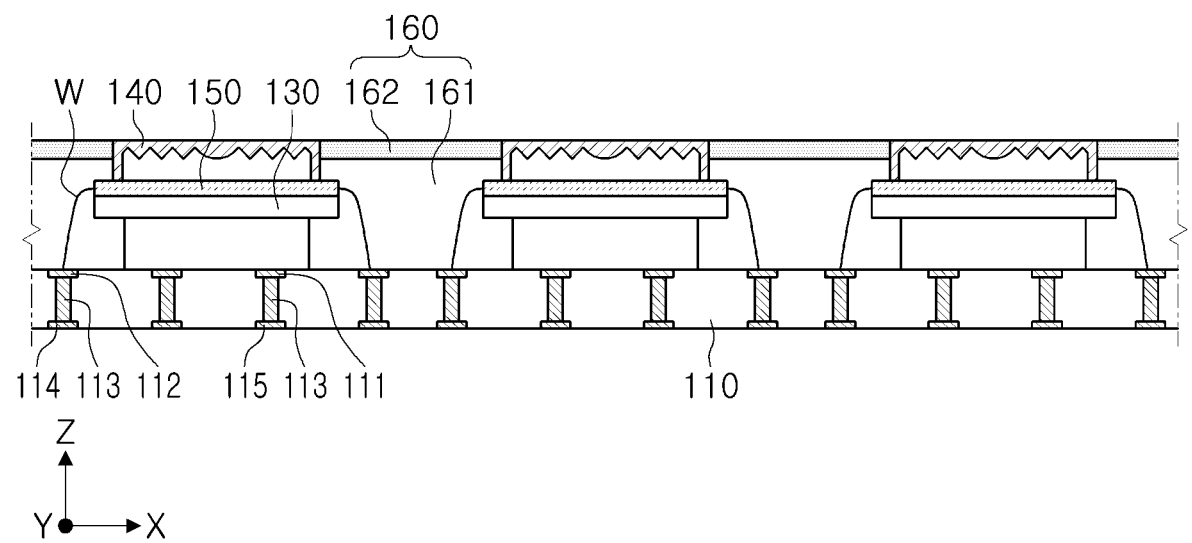
Figure 10C:
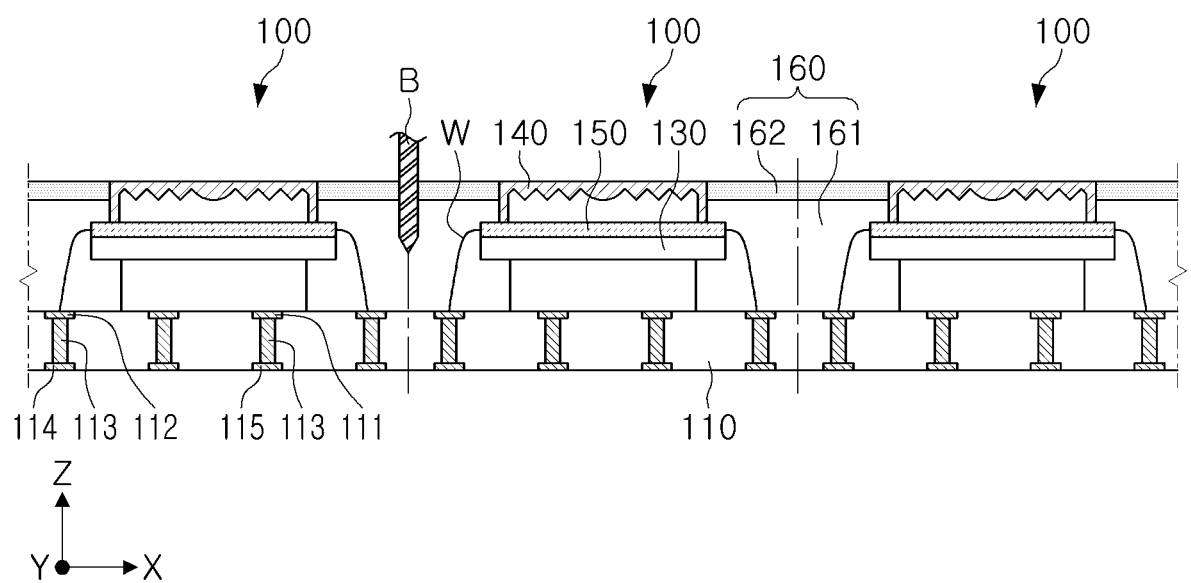

FIGS. 10A to 10C are cross-sectional views of stages in a method of manufacturing the LED package 100A of FIG. 1A.

Referring to FIG. 10A, a plurality of LED chips 120 may be mounted on the substrate 110, and the wavelength conversion film 130, the electrochromic film 150, and the optical lens 140 may be attached to the plurality of LED chips 120, respectively. The plurality of LED chips 120 may be mounted on the substrate 110 by a flip-chip method. The wavelength conversion film 130, the electrochromic film 150, and the optical lens 140 may be attached to form an integrated state, and, alternatively, may be sequentially attached. The LED chip 120, the wavelength conversion film 130, the electrochromic film 150, and the optical lens 140 may be attached to each other by an adhesive member, e.g., epoxy or the like.

Referring to FIG. 10B, the electrochromic film 150 may be connected to a wiring electrode of the substrate 110, and the lateral structure 160 covering an upper surface of the substrate 110, a lateral surface of each of the LED chips 120, a lateral surface of each of the wavelength conversion films 130, a lateral surface of each of the electrochromic films 150, and a lateral surface of each of the optical lenses 140 may be formed. The electrochromic film 150 may be electrically connected to a circuit of the substrate 110 through the connection member W, e.g., a wire or a flexible electrode. In the lateral structure 160, the reflective layer 161 and the color layer 162 may be sequentially formed. The reflective layer 161 and the color layer 162 may be formed by applying and curing the aforementioned resin material. In an example, an upper surface of the color layer 162 may be coplanar with an upper surface of the optical lens 140.

Referring to FIG. 10C, a plurality of LED packages 100 may be formed by cutting the substrate 110 and the lateral structure 160 between the LED chips 120 adjacent to each other. The substrate 110 and the lateral structure 160 may be cut using a blade B. However, embodiments are not limited thereto, and the substrate 110 and the lateral structure 160 may be cut by a laser.

By way of summation and review, since an LED package may be exposed to an exterior of an electronic device, an LED package matching the exterior of the electronic device has been considered. Therefore, an aspect of embodiments provides an LED package having a predetermined color appearance, and an electronic device including the same.

According to embodiments, an electrochromic film and a lateral color layer may be introduced to provide an LED package having a predetermined color appearance and an electronic device including the same. That is, according to embodiments, the electrochromic film in the LED package may be configured to have a predetermined color before applying a voltage, and be converted to be transparent after applying the voltage. Therefore, when a camera module or a flash module is at a standby state, an exterior of an electronic device may be unified to have a same color as the predetermined color of the electrochromic film in the LED package.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light emitting diode (LED) package, comprising:
a substrate including a pair of first wiring electrodes and a pair of second wiring electrodes;
an LED chip on the substrate, the LED chip being electrically connected to the pair of first wiring electrodes;
a wavelength conversion film on the LED chip;
an electrochromic film on the wavelength conversion film, the electrochromic film electrically connected to the pair of second wiring electrodes, and the electrochromic film being configured to have a first color before application of a voltage and to be transparent after application of the voltage;
an optical lens on the electrochromic film; and
a lateral structure on the substrate, the lateral structure including:
a reflective layer covering at least a portion of a lateral surface of each of the LED chip and the wavelength conversion film, a first surface of the reflective layer facing the substrate and being parallel to a bottom of the substrate, and
a color layer on a second surface of the reflective layer and having a second color, the second surface of the reflective layer being opposite the first surface of the reflective layer and being parallel to the bottom of the substrate.

2. The LED package as claimed in claim 1, wherein the optical lens is on an upper surface of the electrochromic film, the color layer covering at least a portion of a lateral surface of the optical lens.

3. The LED package as claimed in claim 2, wherein a width of the electrochromic film is greater than a width of the optical lens, an edge region of the electrochromic film overlapping the color layer in a vertical direction.

4. The LED package as claimed in claim 2, wherein the optical lens has an upper surface substantially coplanar with an upper surface of the color layer.

5. The LED package as claimed in claim 2, wherein the electrochromic film has a same width as the wavelength conversion film.

6. The LED package as claimed in claim 1, wherein the optical lens is on a lower surface of the electrochromic film, the color layer covering at least a portion of a lateral surface of the electrochromic film.

7. The LED package as claimed in claim 6, wherein an upper surface of the electrochromic film is coplanar with an upper surface of the color layer.

8. The LED package as claimed in claim 1, wherein the first color and the second color are substantially a same color.

9. The LED package as claimed in claim 1, wherein:
the optical lens has a first surface facing the wavelength conversion film and a second surface opposing the first surface, and
the first surface includes grooves recessed toward the second surface.

10. The LED package as claimed in claim 9, further comprising an air gap between the first surface of the optical lens and the wavelength conversion film.

11. The LED package as claimed in claim 1, further comprising an optical sensor on the substrate, the optical sensor including a light receiving region, and the light receiving region of the optical sensor extending in a direction adjacent to the LED chip.

12. The LED package as claimed in claim 11, wherein a lateral surface of the optical sensor is covered by the reflective layer of the lateral structure.

13. The LED package as claimed in claim 11, wherein the light receiving region overlaps the electrochromic film in a vertical direction.

14. The LED package as claimed in claim 11, wherein the optical lens is on an upper surface of the electrochromic film, the optical lens and the electrochromic film covering at least a portion of each of the wavelength conversion film and the light receiving region.

15. The LED package as claimed in claim 11, wherein the optical lens is on a lower surface of the electrochromic film, the electrochromic film covering at least a part of each of the wavelength conversion film and the light receiving region.

16. The LED package as claimed in claim 1, wherein, inside the substrate, the pair of first wiring electrodes and the pair of second wiring electrodes are electrically insulated from each other.

17. A light emitting diode (LED) package, comprising:
a substrate;
an LED chip on the substrate;
a wavelength conversion film on the LED chip, a first surface of the wavelength conversion film facing the substrate, and a second surface of the wavelength conversion film being opposite the first surface of wavelength conversion film;
an electrochromic film on the wavelength conversion film, the electrochromic film being configured to be opaque before application of a voltage and be transparent after application of the voltage; and
a reflective layer covering a lateral surface of the LED chip and a lateral surface of the wavelength conversion film, a first surface of the reflective layer facing the substrate, a second surface of the reflective layer being opposite the first surface of the reflective layer, and a distance between the second surface of the reflective layer and a bottom of the substrate being larger than a distance between the second surface of the wavelength conversion film and the bottom of the substrate.

18. The LED package as claimed in claim 17, wherein, before application of the voltage, a light transmittance of the electrochromic film is less than 50%, and the electrochromic film has a predetermined color.

19. The LED package as claimed in claim 17, wherein, after application of the voltage, a light transmittance of the electrochromic film is 80% or more.

20. An electronic device, comprising:
a set cover including a transparent cover with an optical window, the set cover having a first color; and
a light emitting diode (LED) package within the set cover, the LED package being configured to emit light through the optical window, and the LED package including:
a substrate,
an LED chip on the substrate,
an electrochromic film on the LED chip, the electrochromic film being configured to be opaque with a second color before application of a voltage and to be transparent after application of the voltage,
a reflective layer on the substrate and covering a lateral surface of the LED chip, a first surface of the reflective layer facing the substrate and being parallel to a bottom of the substrate, and
a color layer on a second surface of the reflective layer and having a third color, the second surface of the reflective layer being opposite the first surface of the reflective layer and being parallel to the bottom of the substrate.

* * * * *